US006586990B2

(12) United States Patent
Udo et al.

(10) Patent No.: US 6,586,990 B2
(45) Date of Patent: Jul. 1, 2003

(54) OPERATIONAL AMPLIFIER HAVING OFFSET CANCEL FUNCTION

(75) Inventors: Shinya Udo, Kawasaki (JP); Masatoshi Kokubun, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/102,722

(22) Filed: Mar. 22, 2002

(65) Prior Publication Data

US 2003/0034833 A1 Feb. 20, 2003

(30) Foreign Application Priority Data

Aug. 17, 2001 (JP) ........................................ 2001-247907

(51) Int. Cl.[7] ............................................... H03F 1/02
(52) U.S. Cl. ........................... 330/9; 330/253; 330/277; 330/258; 330/257; 330/288; 327/124; 327/307
(58) Field of Search ............................ 330/9, 253, 277, 330/258, 257, 255, 288; 327/124, 307

(56) References Cited

U.S. PATENT DOCUMENTS 6,448,836 B2 * 9/2002 Kokubun et al. ............ 327/307
2003/0034833 A1 * 2/2003 Udo et al. ..................... 330/9

FOREIGN PATENT DOCUMENTS

EP 150606 * 8/1985
JP 11-330874 11/1999

OTHER PUBLICATIONS

Dowlatabadi et al. "A New Offset Cancellation Technique for CMOS Differential Amplifiers" IEEE International.* Symposium on Circuits and Systems and vol. 3, Apr. 30 to May 3 1995 pp. 2229–2232.*

* cited by examiner

Primary Examiner—Michael B Shingleton
(74) Attorney, Agent, or Firm—Arent Fox Kintner Plotkin & Kahn, PLLC

(57) ABSTRACT

An operational amplifier, which generates an output voltage at an output terminal that is equal to an input voltage, comprises: a differential circuit, which compares the input voltage and the output voltage; first and second output transistors, which are controlled by the output of the differential circuit to drive the output terminal; and an offset cancel circuit, connected with the differential circuit, for storing an offset amount of this differential circuit, wherein, in the offset cancel period in which the offset amount is stored by the offset cancel circuit, the output terminal is driven by the second output transistor, and in the operational amplifier operation period following the offset cancel period, the output terminal is driven by the first output transistor.

11 Claims, 8 Drawing Sheets

OPERATIONAL AMPLIFIER HAVING OFFSET CANCEL FUNCTION

BACKGROUND OF THE INVENTION

1. Field of the Invention

The present invention relates to an operational amplifier having an offset cancel function, and more particularly to an operational amplifier having an offset cancel function capable of reducing the period until the output terminal changes to a target potential.

2. Description of the Related Art

Operational amplifiers using MOS transistors have a pair of input transistors connected with a common source terminal, a constant current source, which is connected with this source terminal, a current mirror circuit, which is connected respectively with the drain terminals of the input transistors, and, of the pair of input transistors, the drain terminal of one input transistor is connected with the gate of an output transistor, and the drain of the output transistor is connected with an output terminal, such that, when an input voltage is applied to the gate of one input transistor, the output terminal is fed back to the gate of the other input transistor.

In an operational amplifier of this kind that uses MOS transistors, according to an ideal operation of same, when the gate voltages of the pair of input transistors are equal, the drain currents thereof are then equal and stable. Therefore, in a stable state, the input voltage is generated at the output terminal. As a result, the operational amplifier is able to drive a high capacity load connected with the output terminal. Also, it is possible to provide the output terminal with a voltage that is equal to an input voltage. In other words, there is a very great need to equalize the input voltage and the output voltage.

However, when a variation is produced in drain current characteristics with respect to the gate source voltages of the pair of input transistors, even if the drain currents of the two input transistors are in an equal state and are stable, as a result of the variation in the above drain current characteristics, a slight voltage difference occurs in the gate voltages of the two input transistors. In other words, an offset is produced between the input voltage and the output voltage.

The production of an offset voltage of this kind is unfavorable with regard to the operational amplifier characteristics. For example, in a source drive circuit of a liquid crystal display device, in which a plurality of operational amplifiers drive a plurality of source lines, each operational amplifier output voltage (pixel drive voltage) is different with respect to the same input voltage (adjusted level), and causes a color irregularities in the display image. It is therefore necessary to suppress an operational amplifier offset.

As an operational amplifier that suppresses this offset, the present applicant has proposed a novel operational amplifier that is capable of canceling such an offset. For example, such an operational amplifier is disclosed by the Japanese Patent Application 2000-105980 constant on Apr. 7, 2000.

In the proposed operational amplifier, an offset cancel circuit is connected with a pair of input transistors. In concrete terms, a pair of offset cancel transistors and a constant current source are provided in parallel with a pair of input transistors, and an offset cancel capacitor is connected with the gate of one of these offset cancel transistors.

Further, in the offset charge period, the gates of the pair of input transistors are both connected with the input terminal, and the input terminal is connected respectively with the gate of one offset cancel transistor, an output terminal being connected with the gate of the other offset cancel transistor. In this state, drain currents of an equal gate voltage application state are generated in the pair of input transistors, and, the total of the drain currents of the input transistors and the drain currents of the offset cancel transistors connected in parallel therewith is stabilized in a balanced state. Consequently, a voltage value in this stable state is stored in the offset cancel capacitor and an offset drain current is stored in the offset cancel circuit.

Thereafter, the output terminal is isolated from the gates of the offset cancel transistors, and the input terminal and the output terminal are connected respectively with the pair of input transistors, to thereby establish a normal operational amplifier operational state. In this operational amplifier operation stable state, due to the fact that the offset cancel circuit restores a drain current in an offset cancel period, stability is achieved because the drain currents of the input transistors are also restored to values for when the input voltage and the output voltage are equal. As a result, the production of an offset voltage caused by a variation in transistor characteristics may be suppressed.

Further, a variety of other offset cancel circuits have been proposed, an example of which is an offset cancel circuit which stores an offset voltage in an offset cancel period, and, in an operational amplifier operational state, subtracts this offset voltage from the output voltage.

However, the present inventors have discovered a problem with an operational amplifier that cancels an offset requires a long period for the drive of the output terminal. In the case of a constitution in which in order to shorten the period until a stable state is established in the offset cancel period in particular, a switch is provided between a drive output terminal and a drain terminal of an output transistor, and the switch is turned OFF in the offset cancel period to thereby isolate the load capacitance of the output terminal from the drain terminal of the output transistor, drive of the load capacitance of the output terminal begins after the offset charge period has elapsed, thus necessitating a long period until the output terminal ultimately reaches the input voltage.

In other words, in the case of the above LCD source drain circuit, when, while the pixel gray scale level changes, the input voltage changes from an L level to an H level, the response of the output terminal is delayed comparing to the change to the input voltage, meaning that an LCD with a poor response characteristic can be expected.

The problem of the delaying of the output terminal drive time due to this offset cancel period, is not limited to an offset cancel circuit that stores a drain current, but also arises in an offset cancel circuit that stores an offset voltage.

SUMMARY OF THE INVENTION

It is therefore an object of the present invention to provide an operational amplifier equipped with an offset cancel function that exhibits a more rapid output terminal response characteristic.

Also, it is another object of the present invention to provide an MOS transistor operational amplifier equipped with an offset cancel function and that exhibits a more rapid output terminal response characteristic with respect to a change in the input voltage.

In order to resolve the above-mentioned objects, according to a first aspect of the present invention, an operational amplifier, which generates an output voltage at an output terminal that is equal to an input voltage, comprises: a differential circuit, which compares the input voltage and the output voltage; first and second output transistors, which are controlled by the output of the differential circuit to drive the output terminal; and an offset cancel circuit, connected with the differential circuit, for storing an offset amount of this differential circuit, wherein, in the offset cancel period in which the offset amount is stored by the offset cancel circuit, the output terminal is driven by the second output transistor, and in the operational amplifier operation period following the offset cancel period, the output terminal is driven by the first output transistor.

In order to resolve the above-mentioned objects, according to a second aspect of the present invention, the operational amplifier comprises: (1) a differential circuit, which has first and second input transistors whose sources are connected, a current source connected with the sources, and a current mirror circuit respectively connected to the drains of the first and second input transistors; (2) a first output transistor, which has a gate controlled by the drain of the second input transistor that is supplied with an input voltage, and a drain that is fed back to the gate of the first input transistor during operational amplifier operation; (3) an offset cancel circuit, which is connected with the differential circuit and which stores the offset state of the first and second input transistors; and (4) a second output transistor, which is provided in parallel with the first output transistor.

In the offset cancel period, the offset cancel circuit stores the offset state, and the drains of the first and second output transistors are isolated such that the output terminal is driven by the second output transistor. In addition, in the operational amplifier operation period following the offset cancel period, the output terminal is driven by the first output transistor. Therefore, while the offset cancel circuit stores an offset value in the offset cancel period, the output terminal is driven by the second output transistor toward a target voltage. Consequently, in the operational amplifier operation period following the offset cancel period, the first output transistor has only to drive the voltage of the output terminal, which has been driven to a value close to the target voltage, to the ultimate input voltage. As a result, the time required for the voltage of the output terminal to ultimately reach the input voltage is shortened.

According to the preferred embodiment of the invention described hereinabove, in the offset cancel period, the drain of the second output transistor and the drain of the first output transistor are isolated such that the output load is driven by the second output transistor, and, in the operational amplifier operation period, the second output transistor assumes a non-active state such that the output load is driven by the first output transistor. Therefore, by making the second output transistor non-active in the operational amplifier operation period, the offset cancel state circuit constitution using the first output transistor of the offset cancel period can be maintained as is even in the operational amplifier operation period.

Further, in a preferable embodiment, a first output current transistor is provided between the drain of the first output transistor and a power source, and a second output current transistor is provided between the drain of the second output transistor and the power source, and wherein the ratio in size between the first output transistor and the first output current transistor, and the ratio in size between the second output transistor and the second output current transistor are made equal. As a result of such a constitution, also after a connection is made between the drains of the first and second output transistors in an operational amplifier operational state, the circuit characteristics, which assumed a stable state in the offset cancel period, can be kept the same, so that it is possible to maintain the offset cancel state.

DESCRIPTION OF THE PREFERRED EMBODIMENTS

Figure 1:
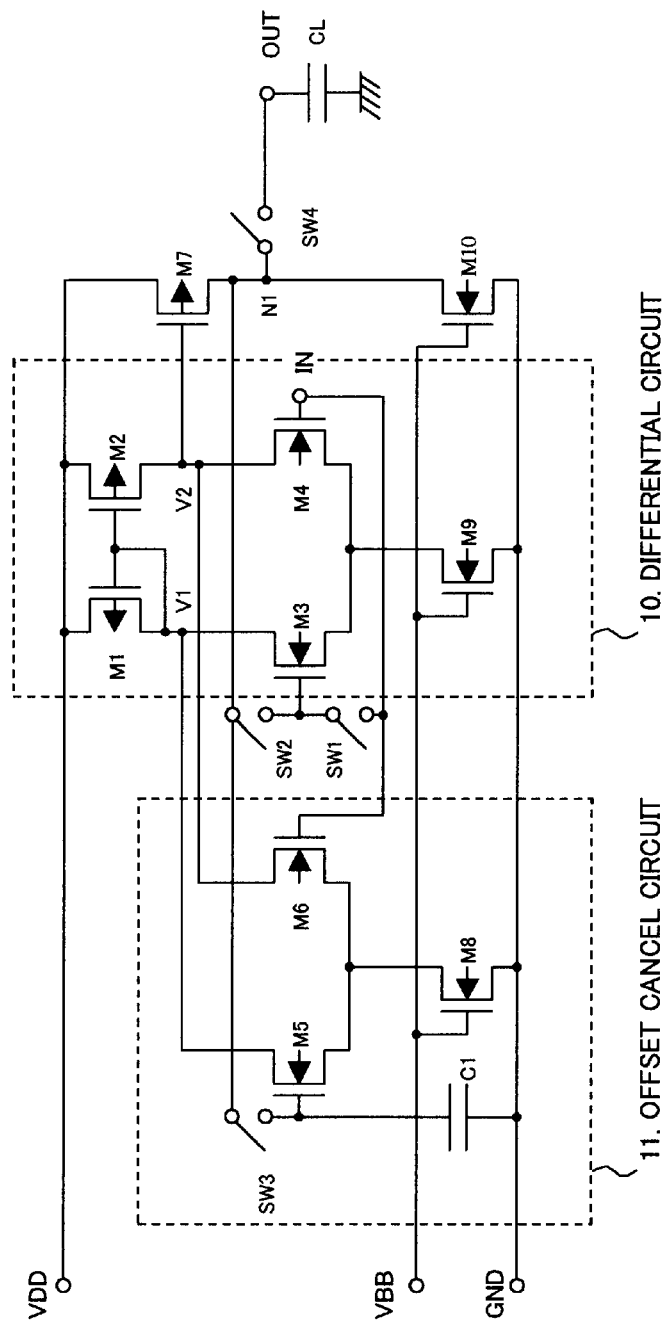
FIG. 1 is a circuit diagram for a previously proposed operational amplifier equipped with an offset cancel function.

The embodiments of the present invention will be described hereinbelow by referring to the drawings. However, the scope of protection of the present invention is not limited by or to the embodiments hereinbelow, and covers the inventions described in the claims, and equivalent thereof.

FIG. 1 is a circuit diagram for a previously proposed operational amplifier equipped with an offset cancel function. This operational amplifier has a differential circuit 10 comprising: first and second input transistors (NMOS) M3, M4, whose sources are connected; a current source transistor (NMOS) M9 connected with these sources; and a current mirror circuit constituted from transistors (PMOS) M1, M2 respectively connected with the drains of the first and second input transistors M3, M4. The operational amplifier also has an output transistor (PMOS) M7 whose gate is connected with the drain of the second input transistor M4 that has an input voltage IN supplied to the gate thereof, such that, in an operational amplifier operational state, the drain N1 of the output transistor M7 is fed back to the gate of the first input transistor M3. This output transistor M7 has a function to pull up the drain N1 to the power source VDD, and a current source transistor (NMOS) M10 for pull-down is provided between this drain N1 and a ground GND.

According to a conventional operational amplifier operation, when the input voltage IN level rises, the transistor M4 assumes a more conductive state such that a greater drain current is produced, and the potential of the node V2 drops, and when, as a result of the output transistor M7 becoming more conductive, the node N1 level is also high such that the node N1 is equal to the input voltage IN, there is conformance between the drain currents of the transistors M3, M4, whereby a stable state is assumed. Conversely, when the input voltage IN level drops, the transistor M4 assumes a more non-conductive state such that a small drain current is produced, and the potential of the node V2 rises, and when, as a result of the output transistor M7 assuming a more non-conductive state, the node N1 level falls in accordance with the current source M10 such that the node N1 and the input voltage IN become equal, and a stable state is assumed. Therefore, in a conventional operational amplifier operation, stabilization is achieved when the drain terminal N1 of the output transistor M7 is at a level equal to the input voltage IN.

However, when a variation exists in the characteristics of the transistors M3, M4, in a stable state in which there is conformance between drain currents, an offset is produced in the gate voltages of the two transistors, which in turn generates an offset in the voltage of the output node N1.

In the circuit in FIG. 1, in order to cancel the offset, an offset cancel circuit 11, which stores an offset state, is connected with the first and second input transistors M3, M4. This offset cancel circuit 11 has a function to store the offset of the drain currents when an input voltage IN is applied to both gates of the pair of input transistors M3, M4.

In other words, in the offset cancel period, by turning a switch SW2 OFF and a switch SW1 ON to apply an input voltage IN to both gates of the pair of input transistors M3, M4, different drain currents are generated on account of a variation in the characteristics of the transistors M3, M4, on the other hand, in order that an equal current should flow in the current mirror circuit M1, M2, an offset drain current is supplied to the offset cancel circuit 11. Also, this drain current is stored in a capacitor C1 in the offset cancel circuit 11. In the subsequent operational amplifier operation period, when the switch SW2 is turned ON and the switch SW1 is turned OFF, the drain of the output transistor M7 is fed back to the gate of the first input transistor M3, and the stored drain current is supplied from the offset cancel circuit 11 to the current mirror circuit M1, M2. As a result, the input transistors M3, M4 are stabilized in a state in which both gates of the input transistors M3, M4 have the same input voltage IN, and the input voltage IN is thus generated at the drain N1.

The offset cancel circuit 11 shown in FIG. 1 is an example of a circuit that stores a drain current in accordance with an offset. In concrete terms, provided in parallel with a pair of input transistors M3, M4 are: first and second offset cancel transistors (NMOS) M5, M6, a current source transistor (NMOS) M8 connected with the sources thereof, and an offset cancel capacitor C1 connected with the gate of the first offset cancel transistor M5. A predetermined bias voltage VBB is applied to the gate of three current source transistors M8, M9, M10.

Figure 2:
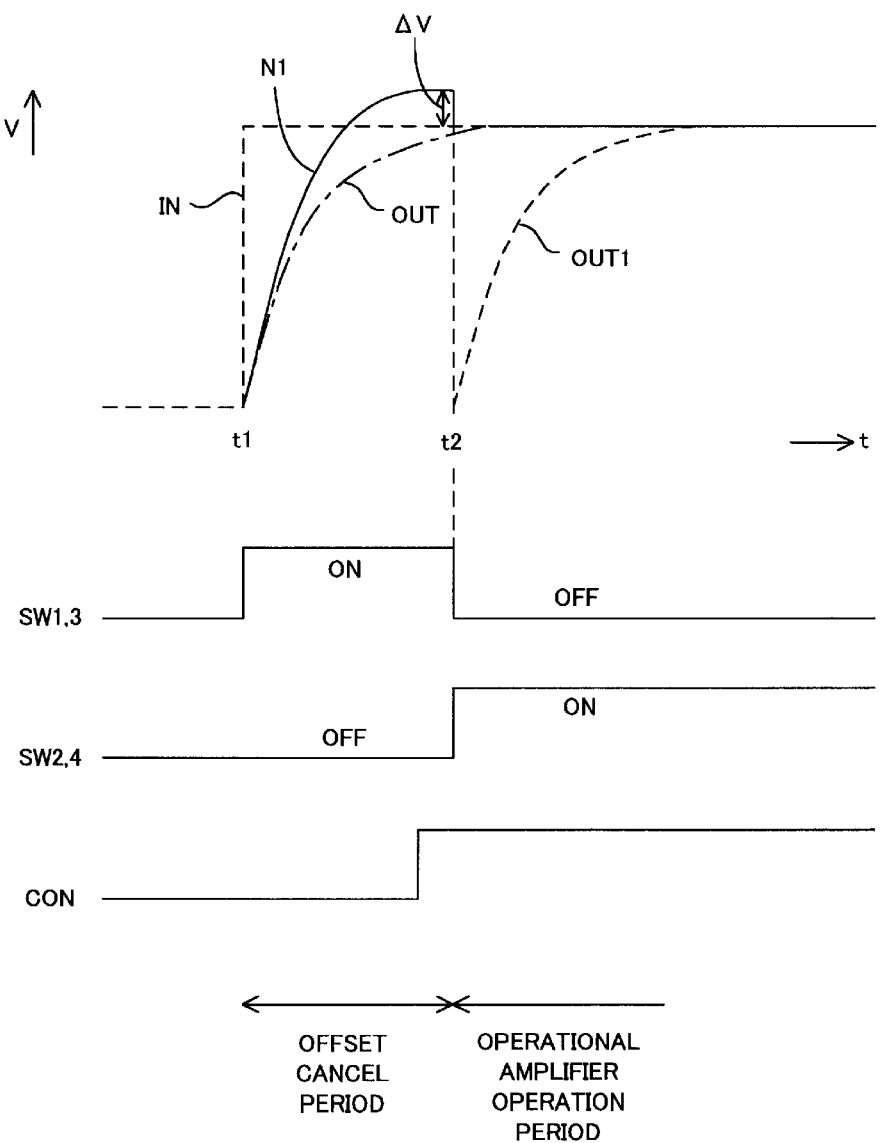
FIG. 2 is a waveform diagram for the operation of the operational amplifier.

FIG. 2 is a waveform diagram for the operation of the operational amplifier in FIG. 1 and also shows the waveform for the operation of the operational amplifier of the present embodiment described hereinbelow. The operational amplifier in FIG. 1 has an offset cancel period from time t1 to t2 in which the switches SW1, SW3 are conductive (on state) and the switches SW2, SW4 are non-conductive (off state), and an operational amplifier operation period from a time t2.

In the offset cancel period, an input voltage IN is applied to the gates of the first and second input transistors as a result of the conduction of the switch SW1, and the drain of the output transistor M7 is fed back to the gate of the first offset cancel transistor M5 as a result of the conduction of the switch SW3, further an input voltage IN is applied to the second offset cancel transistor M6. In addition, in this offset cancel period, the output terminal OUT is isolated from the drain N1 of the output transistor.

As described hereinabove, since there is a variation in the gate-source voltage and drain current characteristics in the input transistors M3, M4, even if the input voltage IN is applied to the gates of both transistors, the drain currents resulting from this input voltage IN differ. Assuming there is a variation in the current drive capability of the first transistor M3 such that this current drive capability is high, the drain current of the first transistor M3 exceeds that of the second transistor M4.

On the other hand, a drain current corresponding to the gate voltage, is also produced in the offset cancel transistors M5, M6 connected in parallel with the input transistors M3, M4. Also, due to the characteristics of the current mirror circuit M1, M3, the current values flowing in the nodes V1, V2 becomes stable with an equal value. In other words, the offset cancel capacitor C1 is charged by the output transistor M7 via the switch SW3, and, a drain current flows in the offset cancel transistors M5, M6 so as to absorb the drain current that differs as a result of the variation in the characteristics of the input transistors M3, M4. Also, in a stable state at time t2, the node N1 has been driven at a voltage value that deviates from the input voltage IN by an offset voltage ΔV, the capacitor C1 is charged according to this voltage IN+ΔV value, and an equal current flows in the current mirror circuit M1, M2. At this time, an equal input voltage IN is applied to the gates of the input transistors M3, M4, and a resultant offset drain current is stored in the offset cancel circuit 11.

Further, as a result of the switch SW4 being open, the load at the node N1 can be made light, meaning that the charging of the offset cancel capacitor C1 is performed in a short time such that a stable state can be reached in a short time.

Thereafter, in the operational amplifier operation period from time t2, the switch SW3 is OFF, and the gate of the first offset cancel transistor M5 is isolated from the drain N1 of the output transistor M7, but, since the charge voltage of the offset cancel capacitor C1 is still applied, the offset cancel transistors M5, M6 maintain as is the drain current of the offset cancel period. Also, the switch SW1 is OFF, the switch SW2 is ON, and the drain N1 of the output transistor is fed back to the gate of the first input transistor M3. In addition, the switch SW4 is ON such that the output terminal OUT is driven by the output transistor M7. The drive of the output terminal is shown using a broken line OUT1 in FIG. 2.

In the operational amplifier operation period, the charge voltage of the capacitor C1 and the input voltage IN are still applied to the gates of the offset cancel transistors M5, M6 respectively, such that a drain current flows therein that is equal to that in the offset cancel period. Consequently, the first and second input transistors M3, M4 also generate a drain current in the offset cancel period when the same input voltage IN is applied thereto, so as to be a stable state. In other words, a stable state is restored that is equal to that of the operational amplifier operation period. As a result, a voltage equal to the input voltage IN is generated in the drain N1 of the output transistor M7, such that the voltage OUT1 of the output terminal is then equal to the input voltage IN, to thereby achieve stability.

As described hereinabove, in a constitution in which offset cancel transistors M5, M6 are connected in parallel with a pair of input transistors M3, M4, and an offset cancel capacitor C1 being connected with the gate of the transistor M5; in the offset cancel period, a state in which the gates of the pair of input transistors M3, M4 are equal is stored in the capacitor C1, and, in the operational amplifier operation period, a state in which the gates of the pair of input transistors M3, M4 are equal is restored. It is thus possible to prevent the production of an offset voltage caused by a variation in transistor characteristics.

Other than the offset cancel circuit shown in FIG. 1, a variety of circuits providing an offset cancel function are conceivable, for example a circuit which stores offset voltage between the output and input produced in the offset cancel period, and then, during the operational amplifier operation period, adds this stored offset voltage to an output terminal.

Irrespective of which particular offset cancel circuit is employed, there is a problem that the offset cancel period is required to precede the operational amplifier operation period and that the drive of the output terminal OUT is therefore delayed. In other words, as shown in FIG. 2, since there is a requirement that the offset cancel period should be prior to drive of the output terminal OUT, there is a problem that in a case, for example, in which the input voltage IN changes greatly, the time for the output terminal OUT being driven to reach the input voltage IN is excessive. This problem leads to a poor response characteristic in the source driver circuit of the LCD, which is undesirable.

Figure 3:
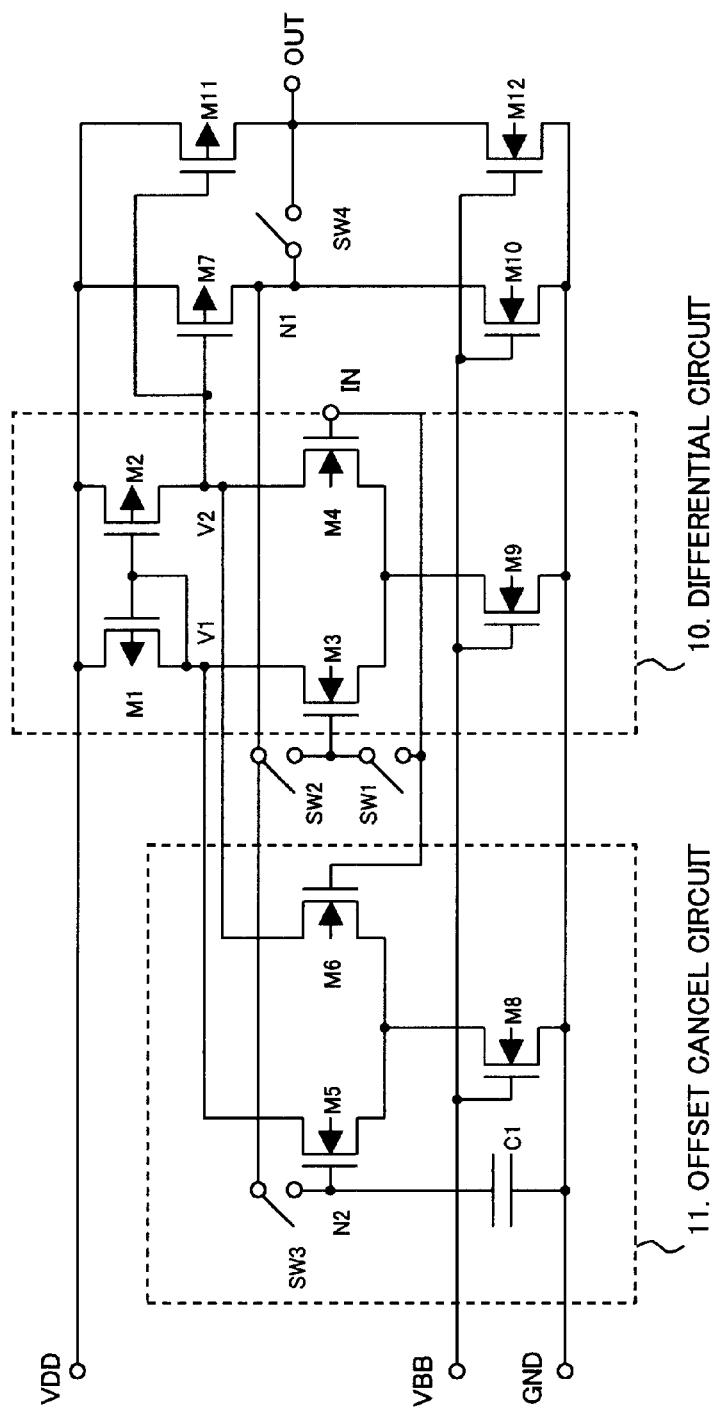
FIG. 3 is a circuit diagram for an operational amplifier equipped with an offset cancel function, according to the present embodiment.

FIG. 3 is a circuit diagram for an operational amplifier having an offset cancel function, according to the present embodiment. Unlike the operational amplifier in FIG. 1, this operational amplifier has a second output transistor (PMOS) M11 and a second output current source transistor (PMOS) M12 connected in parallel with the first output transistor M7 and the first output current source transistor M10. The remaining constitution is the same as that in FIG. 1, the differential circuit 10 and the offset cancel circuit 11 also being the same as those in FIG. 1.

Further, the switches SW1 to SW4 may be CMOS switches, for example. The CMOS switches are connected in parallel between the source and drain of a p-channel transistor and an n-channel transistor respectively, whose gates are controlled by reverse-phase control signals. Consequently, the switches SW1, SW3 are controlled by the same control signal, and the switches SW2, SW4 are controlled by a control signal whose phase is the reverse of that of the control signal for switches SW1, SW3.

The waveform diagram for the operation of the operational amplifier in FIG. 3 is shown in FIG. 2, the waveform of the output terminal OUT being shown using a dot chain line OUT. In the operational amplifier in FIG. 3, when the input voltage IN has changed from an L level to an H level, in the offset cancel period t1 to t2, the switches SW1, SW3 are ON and the switches SW2, SW4 are OFF, and the offset cancel capacitor C1 is charged by the voltage of the node N1 while the gate voltages of the input transistors M3, M4 are equal. As shown in FIG. 2, the level of the node N1 rises from the L level to a level for which the offset voltage ΔV is added to the input voltage IN.

In the offset cancel period t1 to t2, the output terminal OUT load capacity is driven by the second output transistor M11, and, as shown by the dot chain line in FIG. 2, the output terminal OUT rises toward the input voltage IN. Also, since, when the switch SW4 is OFF, the drain N1 of the first output transistor M7 is isolated from the output terminal OUT, the load capacity of the drain N1 is small, and therefore the time taken for a stable state to be achieved by charging the offset cancel capacitor C1 becomes short.

Once the operational amplifier has reached a stable state in the offset cancel period, the switches SW1, SW3 are turned OFF, and the switches SW2, SW4 are turned ON, such that the drain N1 of the first output transistor M7 is connected with the output terminal OUT, and the voltage OUT of the output terminal, which has risen thus far, rises further up to a level that is equal to that for the drain N1, to thereby achieve a stable state. As a result, it may be understood that, in comparison with the output voltage OUT1 in the case of the operational amplifier in FIG. 1, the output voltage OUT of the operational amplifier in FIG. 3 reaches the input voltage IN more rapidly.

The act of achieving a rapid response characteristic of the operational amplifier circuit by adding the second output transistor M11 is also applicable to an operational amplifier provided with an offset cancel circuit different from the offset cancel circuit in FIG. 3. A rapid response characteristic by means of the addition of the second output transistor M11 is also possible in an offset cancel circuit having a function to store the above-described input-output offset voltage, supplies thus stored offset voltage to the output terminal during operational amplifier operation, and cancels input-output offset.

In the operational amplifier in FIG. 3, a first output current source transistor (NMOS) M10 is provided between the drain N1 of the first output transistor and the ground power source GND. This first output current source transistor M10 has a pull-down function such that a fixed current is constantly caused to flow upon application of a constant bias voltage VBB to the gate thereof, the potential of the drain N1 is pulled to the ground GND. The potential of the drain N1 is therefore determined by the transistor size ratio between the first output transistor M7 and the first output current source transistor M10.

The stable state in the offset cancel period is generated with the transistor size ratio between the first output transistor M7 and the first output current source transistor M10 as a prerequisite. Therefore, in the operational amplifier operation period, even at the time when the switch SW4 is ON such that the node N1 and the output terminal OUT are connected, it is required to maintain the stable state of the offset cancel period. For this reason, it is necessary to make the transistor size ratio between the second output transistor M11 and the second output current source transistor M12, being equal to the transistor size ratio between the first output transistor M7 and the first output current source transistor M10. By means of such a constitution, even in the operational amplifier operation period in which the switch SW4 is closed, the circuit constitution for a stable state of the offset cancel period can be reliably maintained.

In addition, as a result of these transistor size ratios being equal, the potential level of the output terminal that is driven by a second output level constituted from the second output transistor M11 and the second output current source transistor M12, can be expected, during the offset cancel period, to be equal to or to approach the ultimate input voltage IN.

Figure 4:
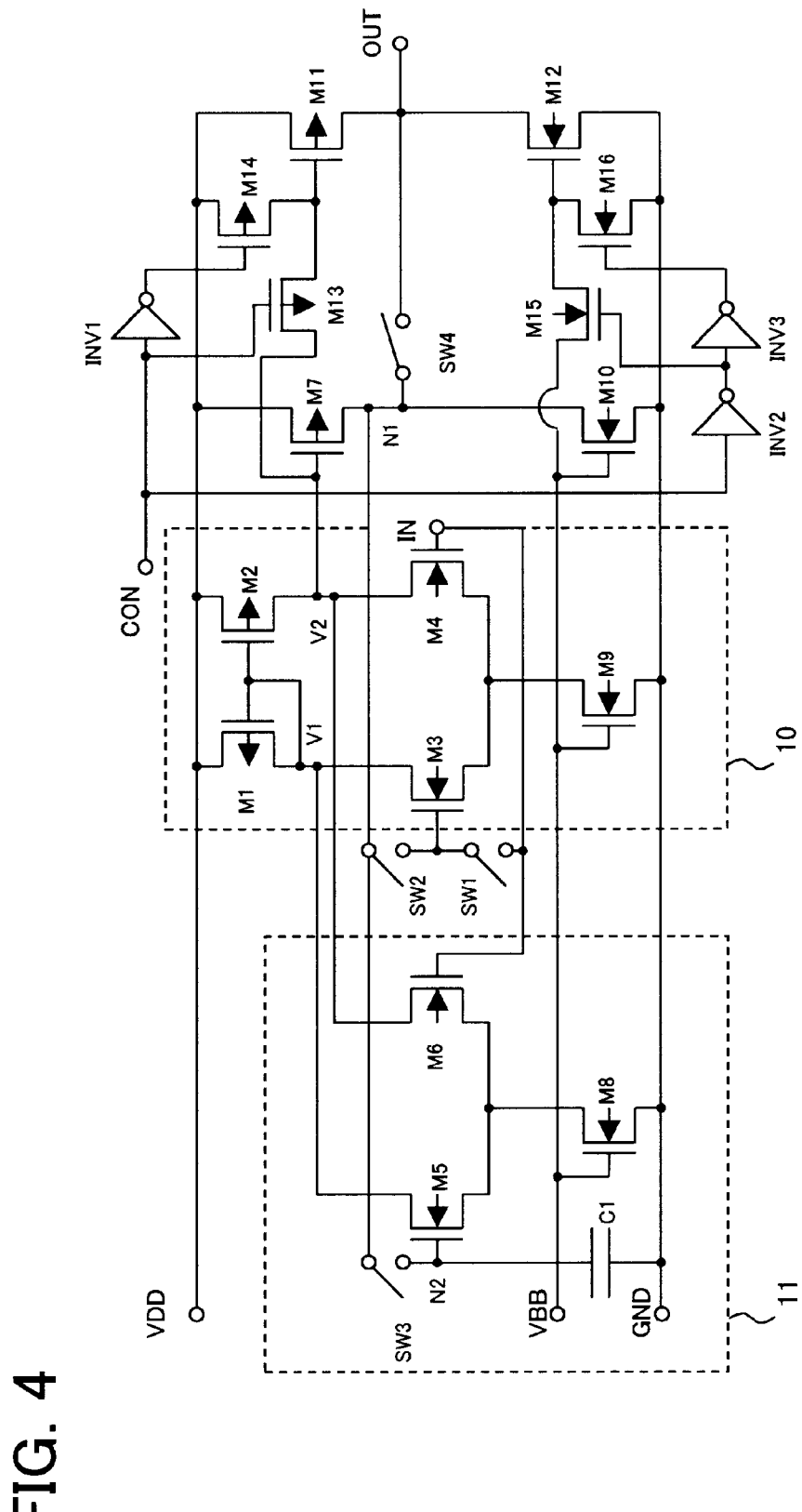
FIG. 4 is a circuit diagram for an operational amplifier according to a second embodiment.

FIG. 4 is a circuit diagram for an operational amplifier according to a second embodiment. This operational amplifier circuit is constituted such that switch transistors M13, M14 (both PMOS) are provided at the gate of the second output transistor M11 and such that switch transistors M15, M16 (both PMOS) are provided at the gate of the second output current source transistor M12. Also, these switch transistors M12, M14, M15, M16 are controlled by a control signal CON and by inverted control signals produced by inverters INV1, INV2, INV3 respectively. The remaining constitution is the same as that for the operational amplifier circuit in FIG. 3, and the differential circuit 10 and the offset cancel circuit 11 are also of the same constitution.

The operational amplifier circuit in FIG. 4 is such that, when the offset cancel period has elapsed, the second output transistor M11 and the second output current source transistor M12 are isolated from the first output transistor M7 and the first output current source transistor M10, and the gates of the second output transistor M11 and the second output current source transistor M12 are connected with a power source VDD and a ground GND, to thus create a non-operational state. In other words, as shown in FIG. 2, by switching the control signal CON from an L level to an H level, the transistors M13, M15 are then both OFF, and the transistors M14, M16 are then both ON. Thereafter, the switch SW4 is ON, whereupon the operational amplifier operation period begins. As a result, in the operational amplifier operation period that follows the offset cancel period, a control operation to the second output transistor M11 in accordance with the output of the differential circuit 10 is halted, and the second output transistor M11 assumes a non-active state. The second output current source transistor M12 also assumes a non-active state in the same manner.

This being so, it is possible to maintain the state of the circuit comprising the differential circuit 10, the offset cancel circuit 11 and the output circuit M7, M10, this state having been stabilized in the offset cancel period, also in the operational amplifier operation period. Therefore, the transistor size ratio between the second output transistor M11 and the second output current source transistor M12, and the transistor size ratio between the transistors M7 and M10 need not necessarily be equal, it being possible to maintain the circuit constitution for a stable state of the offset cancel period also in the operational amplifier operation period.

According to a more favorable operation, at the time of the transition from the offset cancel period to the operational amplifier operation period, first, the transistors M13, M15 are OFF and M14, M16 are ON such that a fluctuation in the output terminal OUT is stopped, and thereafter, after the switch SW3 has been turned OFF, the switch SW2 is turned ON and the switch SW1 is turned OFF. It is thus possible to make the transition to the operational amplifier operation period with the circuit constitution for a stable state of the offset cancel period maintained as is.

Figure 5:
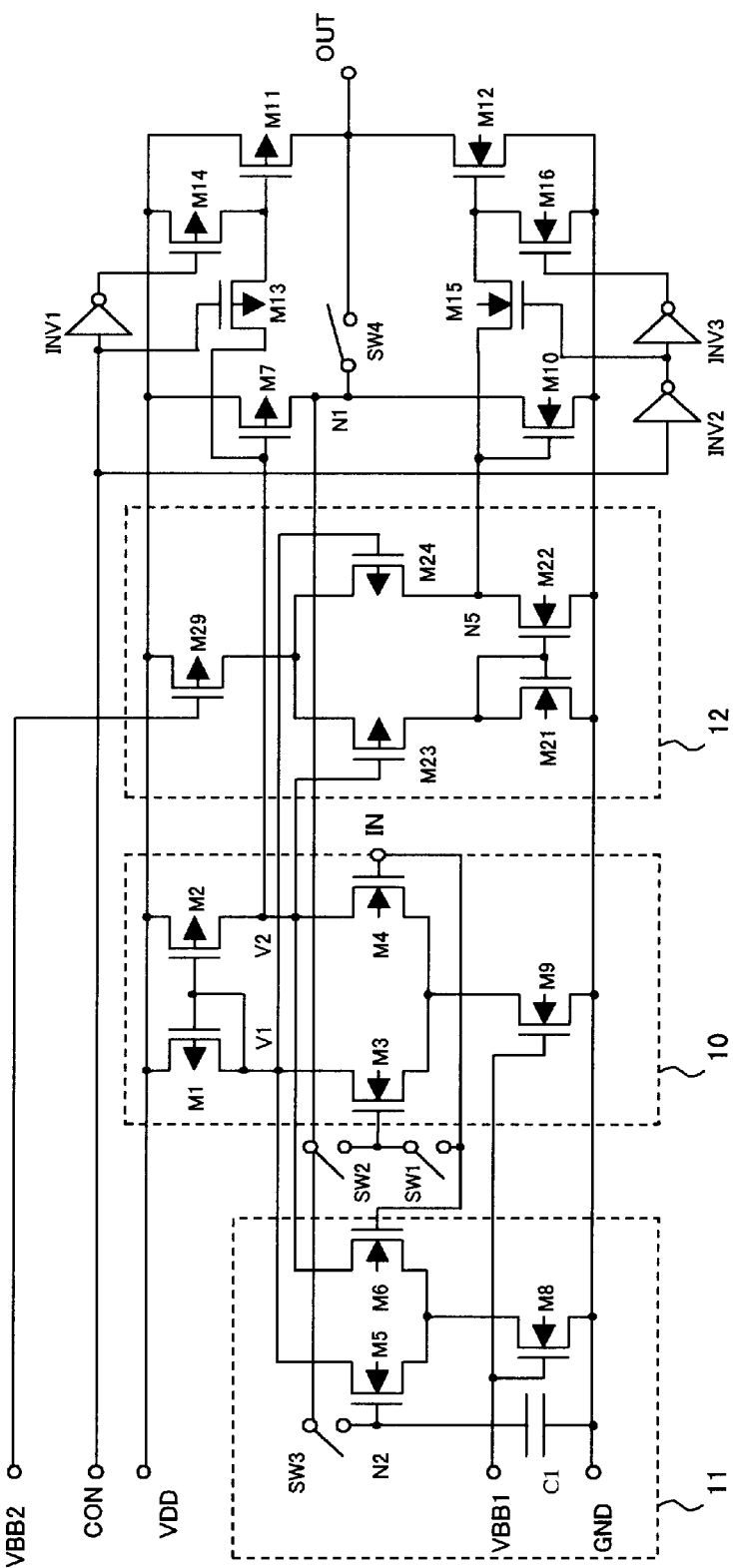
FIG. 5 is a circuit diagram for an operational amplifier according to a third embodiment.

FIG. 5 is a circuit diagram for an operational amplifier according to a third embodiment. In this operational amplifier, an output current source control circuit 12 is provided that controls the gates of the output current source transistors M10, M12. With the exception of this provision, the constitution is the same as that of the operational amplifier in FIG. 4.

In the operational amplifiers in FIGS. 3 and 4, the output transistors M7, M11 to drive the output terminal have a drive operation is controlled by the drain voltage V2 of the second input transistor M4. That is, if the drain voltage V2 falls, the output transistors M7, M11 are more conductive such that drive capability is then high and the potential of the node N1 or of the output terminal OUT is pulled upward. On the other hand, if the drain voltage V2 rises, the output transistors M7, M11 are more non-conductive such that drive capability is then low.

In this regard, the output current source transistors M10, M12 only have a constant bias voltage VBB supplied to the respective gate thereof, whereby a constant drive capability is maintained. Consequently, when the potential of the node N1 or of the output terminal OUT is pulled upward, the pulling up operation is delayed by the drive operation of these output current transistors M10, M12. Also, when the potential of the node N1 or of the output terminal OUT is pulled downward, pulling down simply by means of a constant drive capability of the output current source transistors M10, M12 does not permit a high-speed pulling down operation.

Therefore, an output current source control circuit 12 is provided in the operational amplifier in FIG. 5 such that the gates of the output current source transistors M10, M12 are driven by means of a node N5 that reaches a voltage having the same phase as the drain voltage V2. In other words, the output current source control circuit 12 is constituted by a pair of transistors M24, M23 (PMOS) to whose gates the drains of a pair of input transistors M3, M4 are respectively connected; a current source transistor M29 (PMOS) between the source of the transistors M24, M23 and a power source VDD; and current mirror circuits M21, M22 (NMOS). That is, the output current source control circuit 12 has a constitution which is the reverse of that of a differential circuit 10 that comprises a pair of input transistors M3, M4, current mirror circuits M1, M2, and a current source M9. Also, the potential of the node N5 is the same phase as the potential of the node V2.

Therefore, when control is performed such that the drain voltage V2 falls and the drive capability of the output transistors M7, M11 rises, in the control circuit 12, the transistor M23 assumes a more conductive state, and the transistor M24 assumes a more non-conductive state, such that the potential of the node N5 also falls. Correspondingly, the drive capability of the NMOS output current source transistors M10, M12 drops and the response characteristic of the pull-up operation for the node N1 and the output terminal OUT is then high.

On the other hand, when control is performed such that the drain voltage V2 rises and the drive capability of the output transistors M7, M11 falls, the potential of the node N5 in the control circuit 12 also rises, and the drive capability of the output current source transistors M10, M12 is high, and the response characteristic of the pull-down operation for the node N1 and the output terminal OUT is then high.

Also, when, as the differential circuit of the transistors M3, M4 approaches a stable state, the drain voltages V1, V2 become equal, the differential circuit of the differential transistors M23, M24 in the control circuit 12 also assume a stable state. Correspondingly, the node N1 reaches a potential that corresponds to the impedance ratio accompanying the conductive state of the output transistor M7 and of the output current source transistor M10. The output terminal OUT also reaches a potential that corresponds to the impedance ratio for the transistors M11, M12.

Therefore, by means of the output current source control circuit 12, the conductive state of the first and second output current transistors M10, M12 is dynamically controlled in a reverse direction to that for the conductive state of the first and second output transistors M7, M11, whereby high-speed operation of the operational amplifier is enabled.

Figure 6:
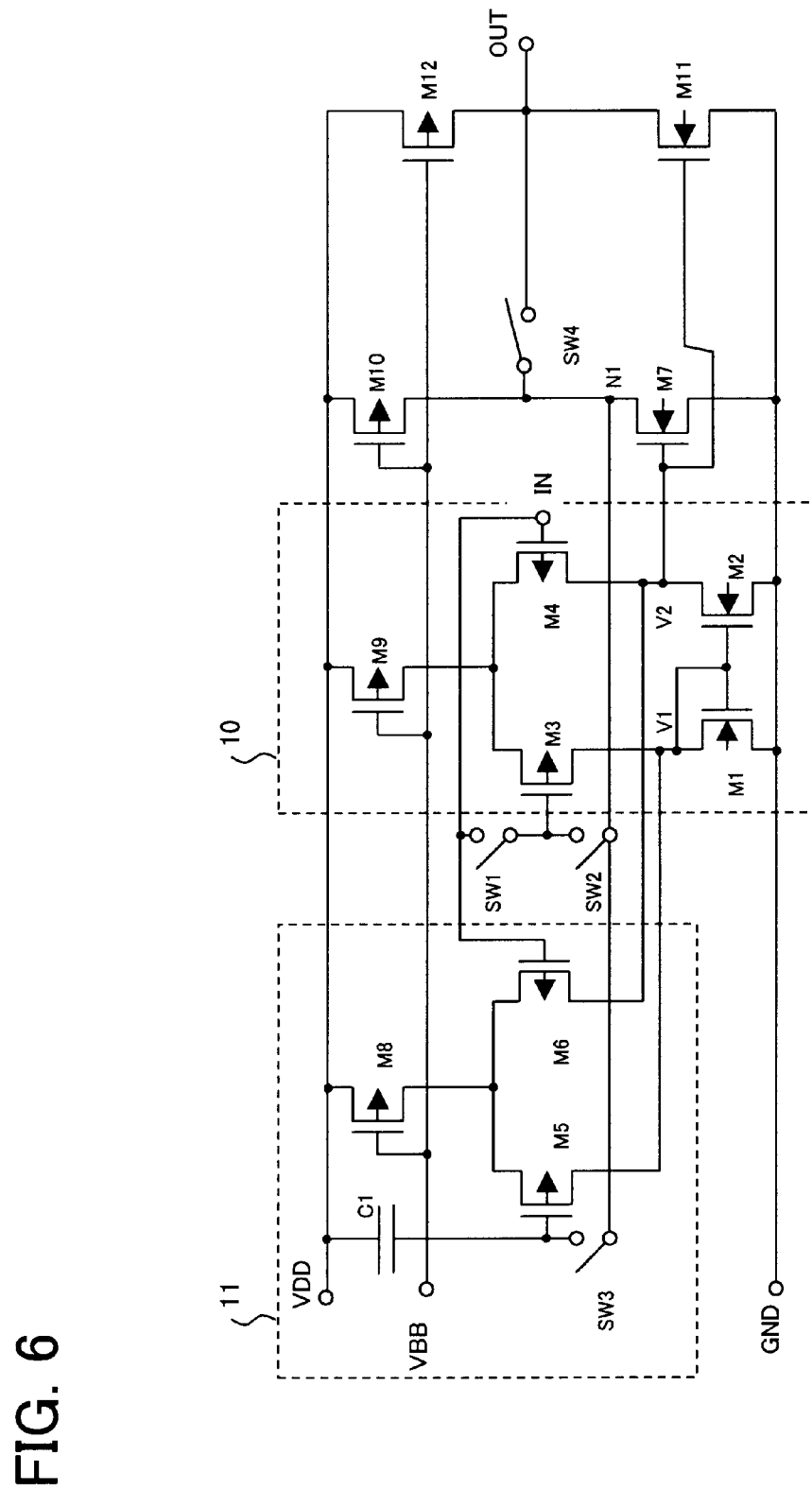
FIG. 6 is a circuit diagram for an operational amplifier according to a fourth embodiment.

FIG. 6 is a circuit diagram for an operational amplifier according to a fourth embodiment. This is a circuit that is vertically symmetrical with the operational amplifier in FIG. 3, and same reference symbols have been assigned to equivalent transistors and switches. Understanding this operational amplifier through comparison with the operational amplifier in FIG. 3, the operational amplifier in FIG. 6 is arrived at by shifting the power source VDD and ground GND in the operational amplifier in FIG. 3 and by reversing the polarity of each transistor.

The operational amplifier in FIG. 6 also has a differential circuit 10, which has a pair of input transistors M3, M4 (PMOS), an offset cancel circuit 11 connected with this differential circuit 10, a first output stage constituted by a first output transistor M7 (NMOS) and a first output current source transistor M10 (PMOS), and a second output stage constituted by a second output transistor M11 (NMOS) and a second output current source transistor M12 (NMOS). Consequently, the node N1 and output terminal OUT are pulled down by means of the output transistors M7, M11. Operation of the differential circuit 10 and of the offset cancel circuit 11 is the same as in FIG. 3.

Figure 7:
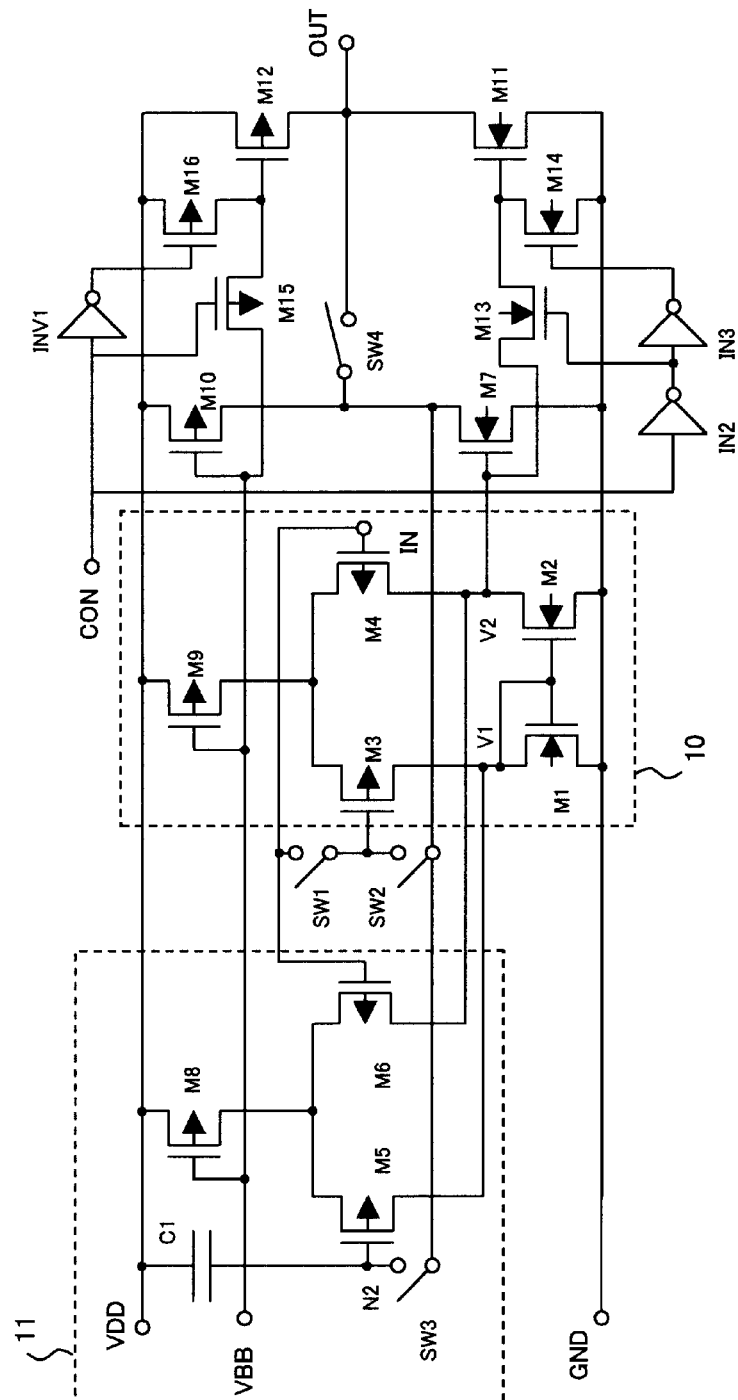
FIG. 7 is a circuit diagram for an operational amplifier according to a fifth embodiment.

FIG. 7 is a circuit diagram for an operational amplifier according to a fifth embodiment. This is a circuit that is vertically symmetrical with the operational amplifier in FIG. 4, and same reference symbols have been assigned to equivalent transistors and switches. Understanding this operational amplifier through comparison thereof with the operational amplifier in FIG. 4, the operational amplifier in FIG. 7 is arrived at by shifting the power source VDD and ground GND in the operational amplifier in FIG. 4 and by reversing the polarity of each transistor.

Therefore, in the operational amplifier in FIG. 7, control is performed using a control signal CON such that, in the offset cancel period, the switch transistors M13, M15 are ON and the transistors M14, M16 are OFF, and, when the offset cancel period has elapsed, control is such that the switch transistors M13, M15 are OFF and the transistors M14, M16 are ON, meaning that the transistors M11, M12 of the second output stage then assume a non-active state. As a result, the circuit constitution for a stable state of the offset cancel period can be maintained also in the operational amplifier operation period.

Figure 8:
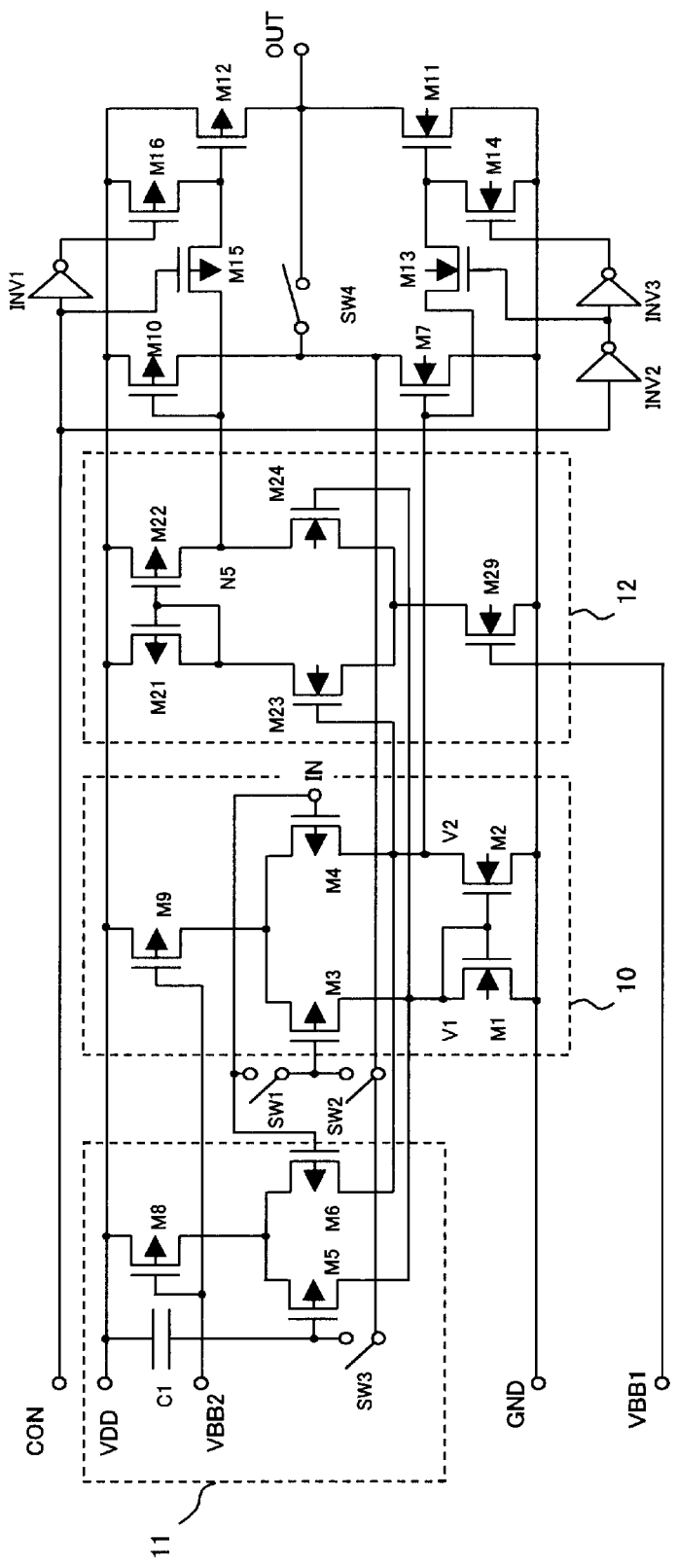
FIG. 8 is a circuit diagram for an operational amplifier according to a sixth embodiment.

FIG. 8 is a circuit diagram for an operational amplifier according to a sixth embodiment. This is a circuit that is vertically symmetrical with the operational amplifier in FIG. 5, and same reference symbols have been assigned to equivalent transistors and switches. Understanding this operational amplifier through comparison with the operational amplifier in FIG. 5, the operational amplifier in FIG. 8 is arrived at by shifting the power source VDD and ground GND in the operational amplifier in FIG. 5 and by reversing the polarity of each transistor. In other words, the provision of an offset cancel circuit 11 and also of an output current source control circuit 12, in the differential circuit 10, enables high speed operation of the operational amplifier circuit.

In the embodiments described above, the invention was described taking the example of an operational amplifier having an offset cancel circuit 11 that stores a drain current offset. However, the present invention is not limited to or by such an offset cancel circuit. If a second output transistor, which drives the output terminal in the offset cancel period, is provided in an operational amplifier having a differential circuit, a first output transistor, and an offset cancel circuit other than that described above, it is equally possible to realize a high-speed response characteristic.

According to the present invention hereinabove, the provision of a second output transistor, which drives an output terminal in an offset cancel period, in an operational amplifier having a differential circuit, an offset cancel circuit, and a first output transistor, makes it possible to afford a very rapid response characteristic for the output voltage in response to a change to the input voltage.

What is claimed is:

1. An operational amplifier, which generates an output voltage at an output terminal equal to an input voltage having:

a differential circuit, which has first and second input transistors whose sources are connected, a current source connected with the sources, and a current mirror circuit connected with the drains of the first and second input transistors;

a first output transistor, which has a gate controlled by a drain of the second input transistor that being supplied with an input voltage, and a drain that is fed back to a gate of the first input transistor during operational amplifier operation;

an offset cancel circuit, which is connected with said differential circuit and which stores an offset state of said pair of input transistors; and a second output transistor, which is provided in parallel with said first output transistor, wherein, in the offset cancel period, drains of said first and second output transistors are isolated such that the output terminal is driven by the second output transistor, and, in the operational amplifier operation period following the offset cancel period, said output terminal is driven by said first output transistor.

2. The operational amplifier according to claim 1, wherein, in said offset cancel period, the gate of said second output transistor is controlled by the drain of said first input transistor.

3. The operational amplifier according to claim 2, wherein, in said operational amplifier operation period, said second output transistor assumes a non-active state such that said output terminal is driven by said first output transistor.

4. The operational amplifier according to claim 3, wherein, in said operational amplifier operation period, the gate of said second output transistor is isolated from the gate of said first output transistor, and is connected to a power source level.

5. The operational amplifier according to claim 1, wherein a first output current source transistor is provided between the drain of said first output transistor and a power source, and a second output current source transistor is provided between the drain of the second output transistor and the power source, and wherein the ratio in size between the first output transistor and the first output current source transistor, and the ratio in size between the second output transistor and the second output current source transistor are made substantially equal.

6. The operational amplifier according to claim 1, wherein a first output current source transistor is provided between the drain of said first output transistor and a power source, and a second output current source transistor is provided between the drain of the second output transistor and the power source, further comprising:

an output current source control circuit, which controls a conduction state of said first and second output current source transistors in a reverse direction to a conduction state of said first and second output transistors.

7. The operational amplifier according to claim 1, wherein, in the offset cancel period, an input voltage is applied to both gates of said first and second input transistors, said offset cancel circuit stores a drain current that corresponds to an offset of drain currents of said first and second input transistors, and, in the operational amplifier operation period, the stored drain current is supplied to said current mirror circuit.

8. The operational amplifier according to claim 1, wherein said offset cancel circuit has: first and second offset cancel transistors connected in parallel with said first and second input transistors; a current source connected to a common source of said first and second offset cancel transistors; and an offset cancel capacitor connected with the gate of the first offset cancel transistor, wherein, in the offset cancel period, an input voltage is applied to both gates of said first and second input transistors, said input voltage is applied to the gate of said second offset cancel transistor, the drain of the first output transistor is connected with the gate of said second offset cancel transistor, and said offset cancel capacitor is charged until said differential circuit assumes a stable state, such that a drain current is stored in accordance with an offset amount of the drain currents of the first and second input transistors, and wherein, in said operational amplifier operation period, the drain of said first output transistor is connected with the gate of the first input transistor and is isolated from the gate of the first offset cancel transistor, such that said stored drain current is supplied from said offset cancel circuit to said current mirror circuit.

9. An operational amplifier, which generates an output voltage at an output terminal equal to an input voltage, having:

a differential circuit, which compares said input voltage and output voltage to generate an output corresponding to the difference therebetween;

first and second output transistors, controlled by an output of said differential circuit, for driving the output terminal; and an offset cancel circuit, which is connected with said differential circuit, for storing an offset amount of the differential circuit, wherein, in the offset cancel period in which said offset amount is stored by said offset cancel circuit, said output terminal is driven by said second output transistor, and wherein, in the operational amplifier operation period following said offset cancel period, said output terminal is driven by said first output transistor.

10. The operational amplifier according to claim 9, wherein, in said operational amplifier operation period, a control operation to said second output transistor in accordance with the output of said differential circuit is halted.

11. A source driver circuit for a display panel, having:

a plurality of operational amplifiers as defined in any of claims 1 through 10, wherein said source driver circuit for a display panel drives a plurality of source lines in a display panel by means of said operational amplifiers.

* * * * *